(12) United States Patent
Schweitzer, Jr.

(10) Patent No.: US 6,429,661 B1
(45) Date of Patent: Aug. 6, 2002

(54) FAULT INDICATOR FOR THREE-PHASE SHEATHED CABLE

(76) Inventor: Edmund O. Schweitzer, Jr., 2433 Center St., Northbrook, IL (US) 60062

( * ) Notice: Subject to any disclaimer, the term of this patent is extended or adjusted under 35 U.S.C. 154(b) by 0 days.

(21) Appl. No.: 09/456,707

(22) Filed: Dec. 9, 1999

(51) Int. Cl.$^7$ .................. G01R 31/02; G01R 31/08; G01R 31/315; G01R 33/00
(52) U.S. Cl. .................. 324/539; 324/529; 324/263; 324/117 R
(58) Field of Search ................ 324/529, 539, 324/542, 219, 260, 261, 263, 117 R, 117 H

(56) References Cited

U.S. PATENT DOCUMENTS

| | | | |
|---|---|---|---|
| 3,426,276 A | 2/1969 | Schweitzer, Jr. | 324/127 |
| 3,676,740 A | 7/1972 | Schweitzer, Jr. | 317/22 |
| 3,702,966 A | 11/1972 | Schweitzer, Jr. | 324/133 |
| 3,708,724 A | 1/1973 | Schweitzer, Jr. | 317/22 |
| 3,715,742 A | 2/1973 | Schweitzer, Jr. | 340/253 |
| 3,781,682 A | 12/1973 | Schweitzer, Jr. | 324/133 |
| 3,816,816 A | 6/1974 | Schweitzer, Jr. | 324/133 |
| 3,876,911 A | 4/1975 | Schweitzer, Jr. | 317/58 |
| 3,906,477 A | 9/1975 | Schweitzer, Jr. | 340/253 |
| 3,974,446 A | 8/1976 | Schweitzer, Jr. | 324/133 |
| 3,991,366 A | 11/1976 | Schweitzer, Jr. | 324/133 |
| 4,063,171 A | 12/1977 | Schweitzer, Jr. | 324/133 |
| 4,086,529 A | 4/1978 | Schweitzer, Jr. | 324/127 |
| 4,096,539 A * | 6/1978 | Scaturro | 324/539 X |
| 4,234,847 A | 11/1980 | Schweitzer, Jr. | 324/146 |
| 4,251,770 A | 2/1981 | Schweitzer, Jr. | 324/133 |
| 4,263,550 A | 4/1981 | Schweitzer, Jr. | 324/133 |
| 4,288,743 A | 9/1981 | Schweitzer, Jr. | 324/127 |
| 4,375,617 A | 3/1983 | Schweitzer, Jr. | 324/133 |
| 4,414,543 A | 11/1983 | Schweitzer, Jr. | 340/651 |
| 4,424,512 A | 1/1984 | Schweitzer, Jr. | 340/664 |
| 4,438,403 A | 3/1984 | Schweitzer, Jr. | 324/133 |
| 4,456,873 A | 6/1984 | Schweitzer, Jr. | 324/51 |
| 4,458,198 A | 7/1984 | Schweitzer, Jr. | 324/133 |
| 4,641,220 A | 2/1987 | Schweitzer, Jr. | 361/187 |
| 4,686,518 A | 8/1987 | Schweitzer, Jr. | 340/664 |
| 4,794,329 A | 12/1988 | Schweitzer, Jr. | 324/127 |
| 4,794,331 A | 12/1988 | Schweitzer, Jr. | 324/133 |
| 4,794,332 A | 12/1988 | Schweitzer, Jr. | 324/133 |
| 4,795,982 A | 1/1989 | Schweitzer, Jr. | 324/508 |
| 4,904,932 A | 2/1990 | Schweitzer, Jr. | 324/133 |
| 5,008,651 A | 4/1991 | Schweitzer, Jr. | 340/664 |
| 5,070,301 A | 12/1991 | Schweitzer, Jr. | 324/509 |
| 5,153,565 A | 10/1992 | Schweitzer, Jr. | 340/650 |
| 5,218,307 A * | 6/1993 | Hiller | 324/541 |
| 5,220,311 A | 6/1993 | Schweitzer, Jr. | 340/650 |
| 5,274,324 A | 12/1993 | Schweitzer, Jr. | 324/96 |
| 5,406,195 A | 4/1995 | Schweitzer, Jr. | 324/96 |
| 5,420,502 A | 5/1995 | Schweitzer, Jr. | 324/96 |
| 5,677,623 A | 10/1997 | Schweitzer, Jr. | 324/133 |
| 5,677,678 A | 10/1997 | Schweitzer, Jr. | 350/664 |
| 5,821,869 A | 10/1998 | Schweitzer, Jr. | 340/660 |
| 5,889,399 A | 3/1999 | Schweitzer, Jr. | 324/133 |

* cited by examiner

Primary Examiner—Glenn W. Brown
(74) Attorney, Agent, or Firm—Cook, Alex, McFarron, Manzo, Cummings & Mehler

(57) ABSTRACT

A fault indicator for three phase sheathed cables includes a flexible collar unit which fits over the cable. Magnetic pole pieces within the collar unit having associated magnetic windings are aligned with the three conductors within the cable to produce signals indicative of the current level in each conductor. An alarm unit receives the signals and sounds an alarm in the event the current in any conductor exceeds a predetermined threshold level to indicate the occurrence of a fault. The voltage level of the current indicating signals may be utilized to align the magnetic core assemblies with the conductors.

30 Claims, 3 Drawing Sheets

FAULT INDICATOR FOR THREE-PHASE SHEATHED CABLE

BACKGROUND OF THE INVENTION

In electrical power distribution systems it is frequently necessary to sense the occurrence of fault currents in three phase underground cables, which typically consist of three 120° radially spaced conductors encased within an electrically conductive lead or lead sheath and an overlaying PVC jacket. The cables are typically run from vault to vault, the conductors being buried in the ground or routed through conduits between the vaults and being accessible through the uncovered vault or manhole.

Conventional current transformers cannot be used for sensing fault current in three phase sheathed cables because the sum of the balanced 3 phaser currents is zero, so that the net current sensed by the transformer is zero. Consequently, prior devices for sensing fault currents in such cables have been installed at cable splices or terminations, where individual conductors are accessible and the phase currents can be separately sensed.

The present invention is directed to a fault indicator which senses faults in a three phase cable without physical access to the individual conductors within the cables, thereby allowing the indicator to be positioned at any location along the cable, such as where the cable passes unterminated through a cable vault. For optimum performance in this environment, the fault indicator is moisture-proof and includes an aural alarm which, in the event of a fault, can be heard from outside the cable vault, thereby obviating the need for physical inspection of individual fault indicators along the cable.

Accordingly, it is a general object of the present invention to provide a new and improved fault indicator for sensing the occurrence of a current in three phase power distribution cables.

It is a more specific object of the present invention to provide a fault indicator which senses fault currents in three phase sheathed cables without the need for physical access to individual conductors within the cable.

It is another specific object of the present invention to provide a fault indicator which can be installed at any location along the length of a three phase sheathed cable.

SUMMARY OF THE INVENTION

The invention is directed to a fault indicator for sensing a fault current in a three phase three conductor sheathed cable of the type having first, second and third electrical conductors. The fault indicator comprises first, second and third magnetic pole pieces arranged primarily in the magnetic fields surrounding the first, second and third conductors, respectively, first, second and third magnetic windings in magnetic communication with the first, second and third pole pieces, respectively, for developing first, second and third signals indicative of the current level in the first, second and third conductors, respectively, indicator circuit means responsive to the first, second and third signals for indicating the occurrence of a fault current in the conductor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figures 1, 1A:
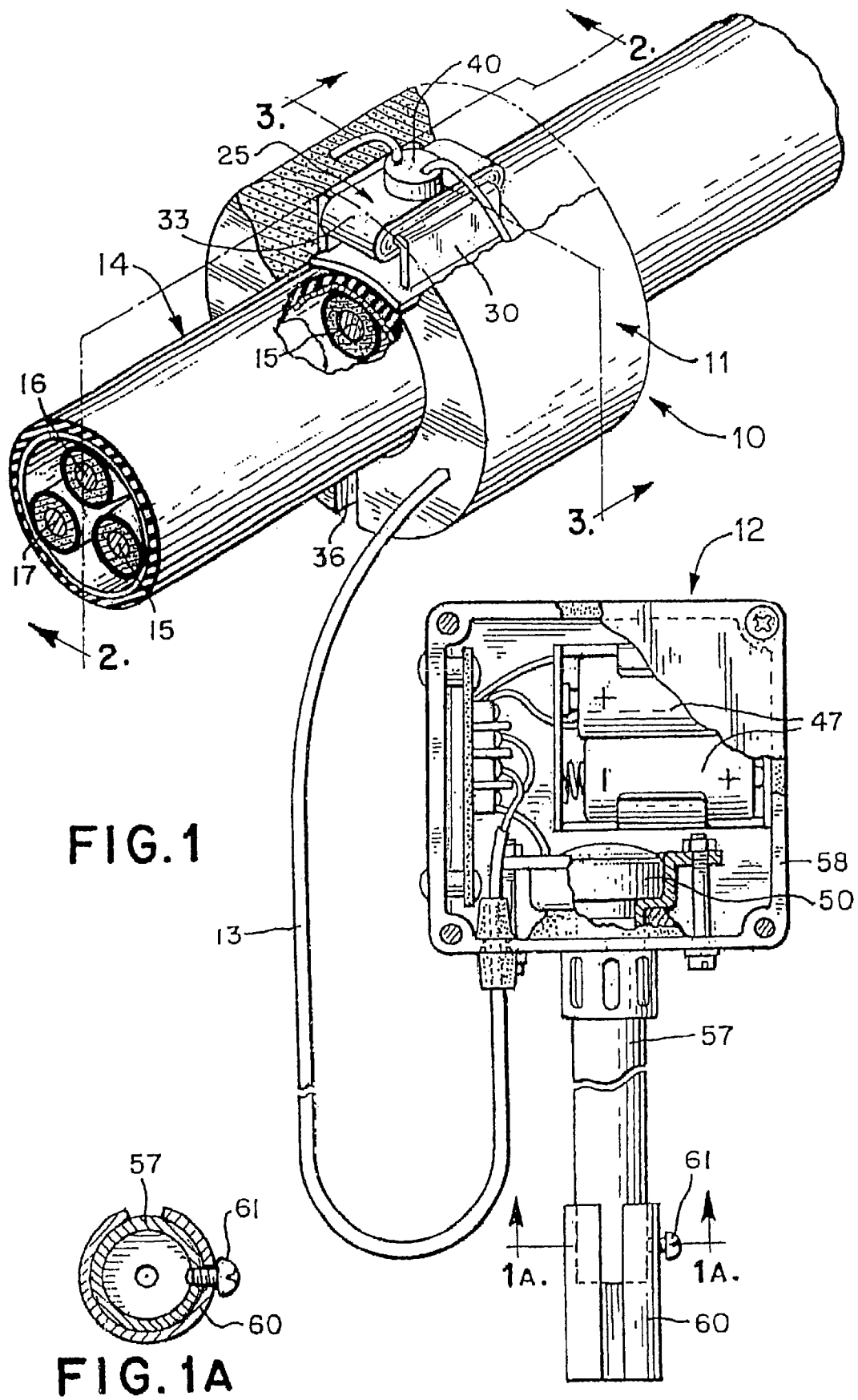
FIG. 1 is a perspective view partially broken away of a fault indicator constructed in accordance with the invention shown installed on a three phase sheathed cable of the type used in underground power distribution systems.
FIG. 1A is a cross-sectional view of the alarm sound reflector of the fault indicator taken along line 1$a$—1$a$ of FIG. 1.
Figure 2:
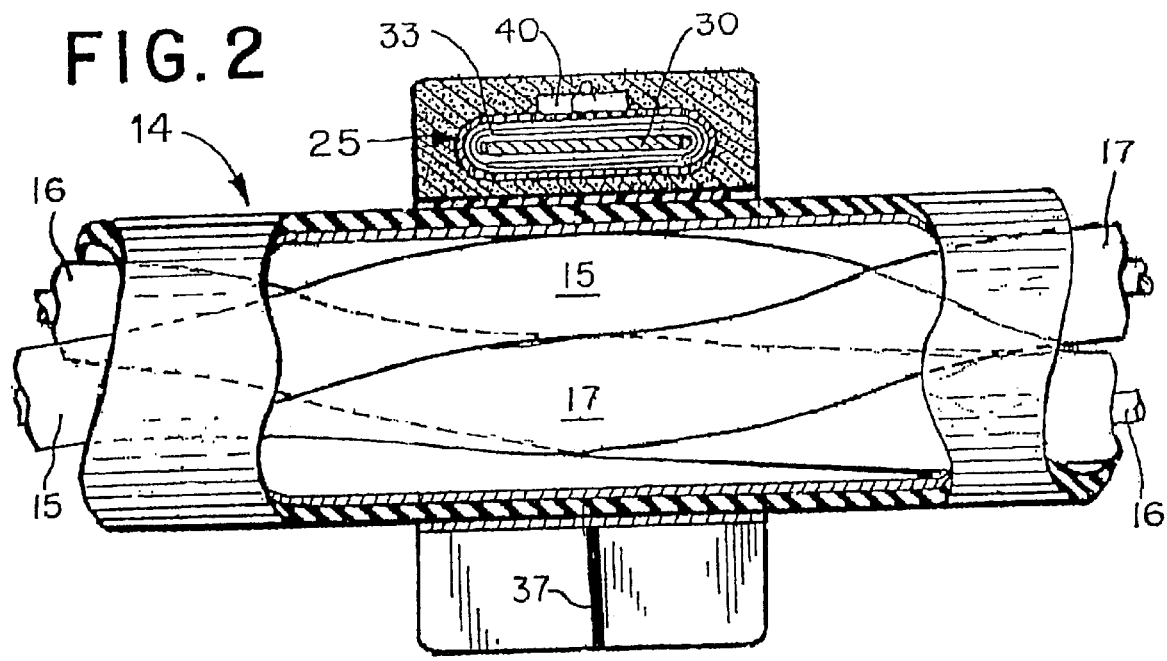
FIG. 2 is an enlarged cross-sectional view of the fault indicator taken along line 2—2 of FIG. 1.

Referring to the Figures, and particularly to FIG. 1, a fault indicator 10 constructed in accordance with the invention includes a fault sensing collar unit 11 and a remote alarm unit 12. The two units, which may be some distance apart, are connected by a cable 13.

The collar unit 11 is shown installed on a three phase sheathed conductor 14 of the type used in underground power distribution systems. In accordance with conventional practice, conductor 14 may include three standard copper electrical conductors 15, 16 and 17, corresponding to respective phases of a three phase circuit. Conductors 15, 16 and 17 are provided with electrically insulating jackets 20, 21 and 22, respectively. The three jacketed conductors are contained with a metallic sheath 23, which may be formed of a corrugated aluminum or, in older cable constructions, a layer of lead. The metallic sheath is covered with a jacket 24 formed by a layer of PVC or similar material. One example of a sheathed cable of this construction is the C-L-X™ type MV-105 cable marketed by The Okomite Company.

Figure 3:
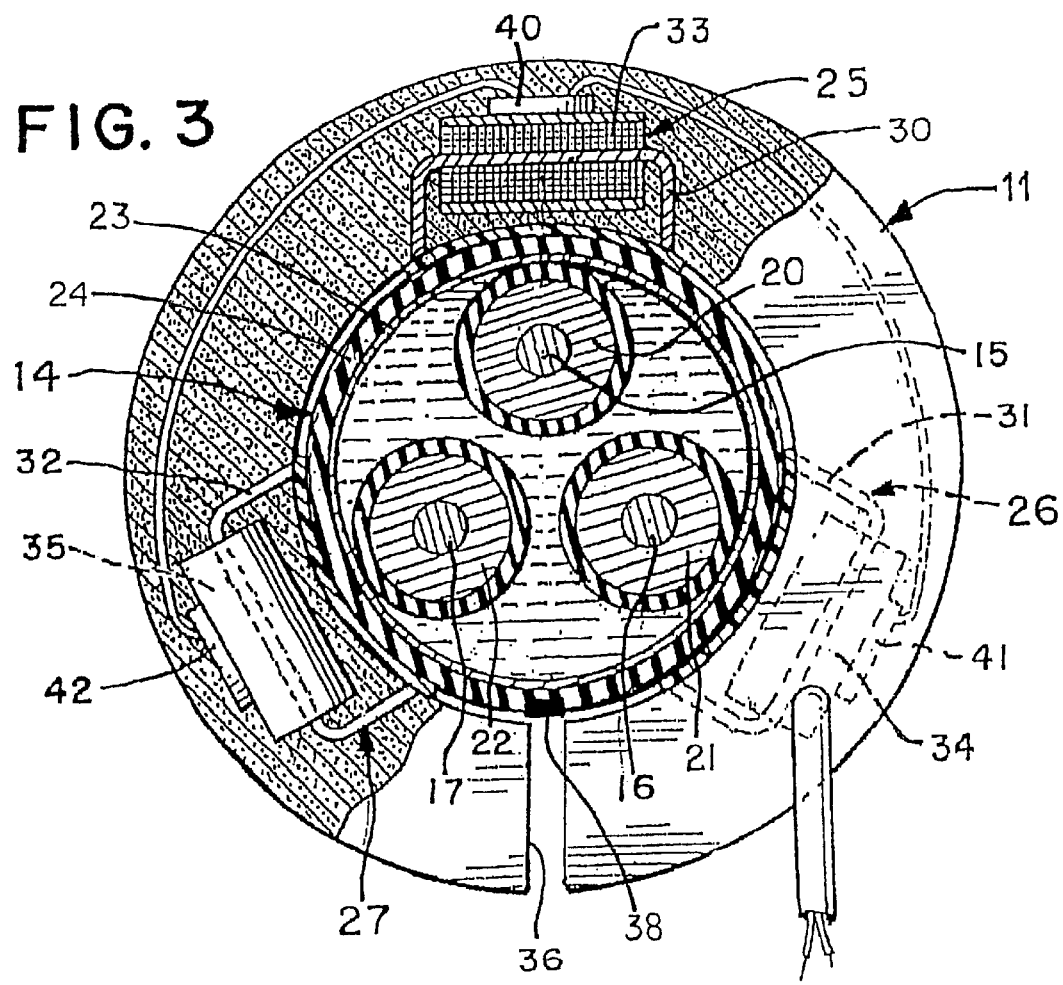
FIG. 3 is an enlarged cross-sectional view of the fault indicator taken along line 3—3 of FIG. 1.
Figure 4:
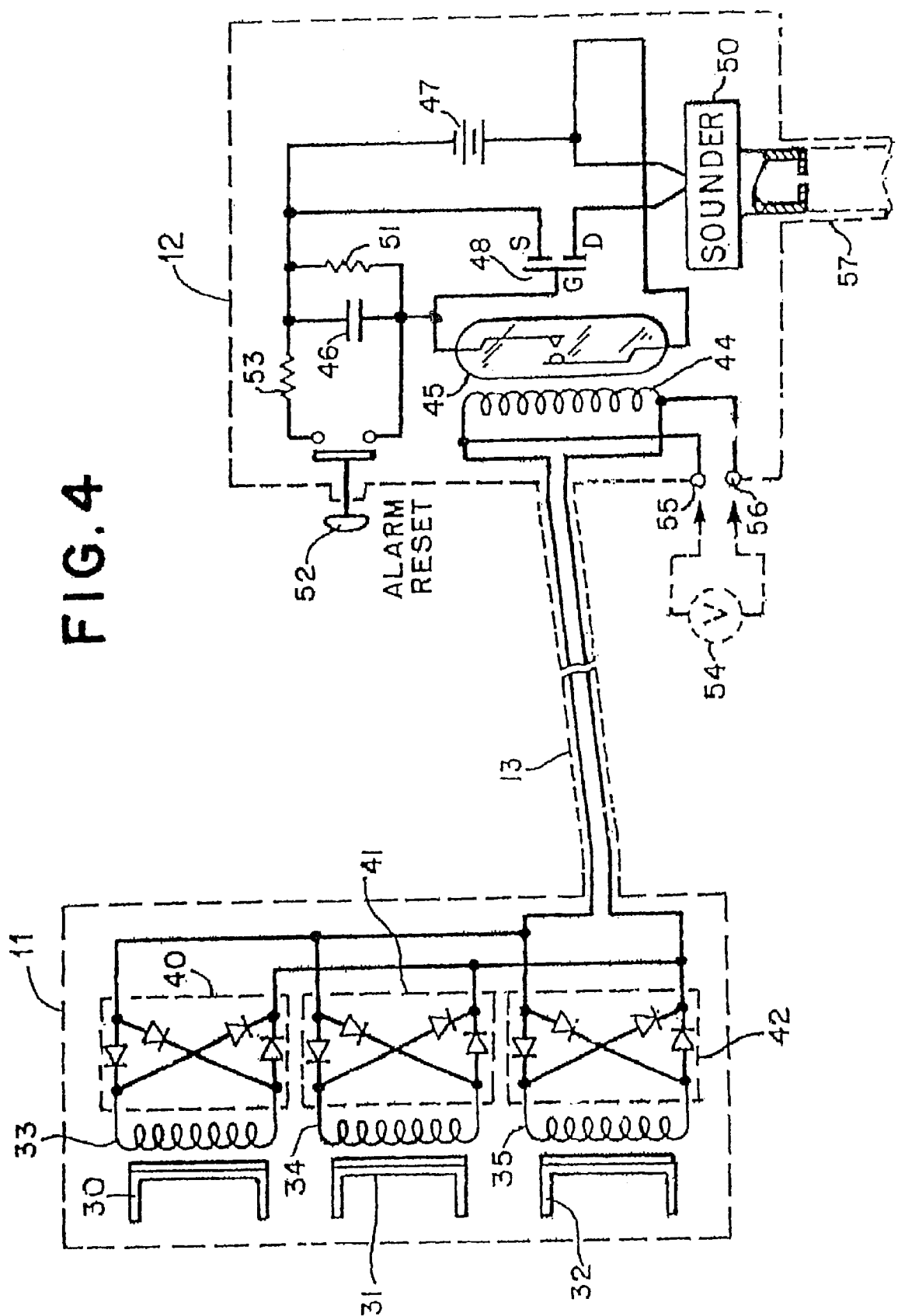
FIG. 4 is a schematic diagram of the fault indicator of FIGS. 1–3.

As best shown in FIG. 3, in order to sense current flow in conductors 15–17 collar unit 11 includes three magnetic sensing assemblies 25, 26 and 27 associated with conductors 15, 16 and 17, respectively. The sensing assemblies includes individual generally U-shaped magnetic pole pieces 30, 31 and 32 each disposed in a plane perpendicular to the conductors and each having projecting pole portions arranged to bracket a respective one of the conductors. Individual magnetic windings 33, 34 and 35 are provided on the center portions of respective ones of the pole pieces to sense the magnitude of the magnetic flux surrounding the conductors, and hence the magnitude of the current in the conductor. Since the U-shaped pole pieces are aligned to provide a magnetic circuit for only the field in the bracketed adjacent conductors, and typically span only approximately 60° of the circumference of the cable, their associated windings are sensitive only to the associated conductor.

For optimum sensing it is necessary that the three magnetic pick-up assemblies 25, 26 and 27 be accurately aligned with the three conductors 15, 16 and 17. To this end, the collar assembly, which is formed of a flexible elastomeric material, is provided with a slot 36 which allows it to be opened up and slipped over cable 14, and thereafter to be rotated around the cable until the magnetic sensing assemblies are aligned with the conductors. An index mark 37 may be provided on the collar to enable alignment with a mark 38 made on the cable jacket 24 when the collar is removed and subsequently reinstalled.

Encapsulated full-wave bridge rectifier circuits 40, 41 and 42 may be connected to windings 33, 34 and 35 such that each of the magnetic sensing assemblies 25, 26 and 27 (FIG. 3) each develop a DC output signal indicative of the current in their respective conductor. In the illustrated embodiment of the invention, the outputs of the three bridge rectifier circuits are connected in parallel and applied to a winding 44 in alarm unit 12 such that a fault current in any one of conductors 15, 16 and 17 will result in a current flow in the winding sufficient to close a reed switch 45 disposed adjacent to and in magnetic communication with the winding. Closure of the reed switch 45 causes a trigger capacitor 46 to be charged by an internal battery 47. This in turn is connected to the gate electrode of a field effect transistor (FET) 48, conditioning the FET to a conductive state and allowing battery 47 to supply operating current to a conventional DC powered alarm transducer 50. After the fault current has subsided, reed contacts 45 open and capacitor 46 slowly discharges through resistor 51. Eventually capacitor 46 discharges to the extent that FET 48 opens and the alarm ends. Also, the alarm can be manually reset by means of a push button switch 52, which rapidly discharges capacitor 46 through a current-limiting resistor 53.

To assist in aligning collar unit 11 on cable 14 an optional voltmeter 54 may be connected across the outputs of rectifier circuits 40, 41 and 42 and the collar rotated for maximum voltage reading. To this end, terminals 55 and 56 may be provided on the housing of alarm unit 12.

To protect the alarm transducer 50 from rising water levels, such as may occur in a cable vault, the output port of the transducer is connected to a vertical tube 57 which extends downwardly from the alarm unit housing 58 such that trapped air in the tube prevents rising water from coming into contact with the transducer port. An adjustable sleeve extension 60 attached to sleeve 57 by a machine screw 61 may be provided to assist in directing the audio output of the alarm transducer.

While the output signals generated by the three magnetic sensing assemblies 25, 26 and 27 have been connected to actuate an alarm, it is also possible to actuate an electromechanical fault indicator, such as shown, for example, in U.S. Pat. No. 4,414,543, or to actuate an LCD fault indicator, such as shown in, for example, U.S. Pat. No. 5,406,195, both issued to the present inventor. Also, instead of using a single alarm or indicator, it will be appreciated that the outputs could be individually connected to individual alarm units or indicators, thereby indicating, provided the phases were first identified, which of the three phases had experienced the fault current. Moreover, the alarm circuit could provide for contact closure, thereby enabling a remote alarm to be sounded by means of a conventional SCADA circuit or by carrier current modulation on the monitored conductors.

Also, it is possible to combine the collar unit 11 and the alarm unit 12 to obtain a single collar assembly wherein the fault indication, aural and/or visual, is contained on the collar. Moreover, instead of the optional voltmeter 54 and contacts 55 and 56, it is possible to use a separate magnetic sensing assembly which is rotated around the collar to locate and mark the correct alignment for the cable, the collar unit then being installed according to the marking.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for sensing a fault current in a three phase three conductor sheathed cable of the type having first, second and third electrical conductors enclosed within the sheath, comprising:
    first, second and third magnetic pole pieces arranged outside of the sheath and primarily in magnetic fields surrounding said first, second and third conductors, respectively;
    first, second and third magnetic windings in a magnetic communication with said first, second and third pole pieces, respectively, for developing first, second and third signals indicative of the current level in said first, second and third conductors, respectively; and
    indicator circuit means responsive to said first, second and third signals for indicating the occurrence of a fault current in said first, second and third conductors.

2. A fault indicator for sensing a fault current in a three phase three conductor sheathed cable as defined in claim 1 wherein said magnetic pole pieces each comprise a generally U-shaped magnetic core member having a center portion and projecting end portions generally spanning a respective one of said conductors.

3. A fault indicator for sensing a fault current in a three phase three conductor sheathed cable as defined in claim 2 wherein said first, second and third magnetic windings are disposed on the center portion of said first, second and third magnetic pole pieces, respectively.

4. A fault indicator for sensing a fault current in a three phase three conductor sheathed cable as defined in claim 1 wherein said indicator circuit means include an alarm transducer, a battery and a switching transistor, said switching transistor being conditioned to a conductive sate by the signals developed by said magnetic windings to connect said battery to said alarm transducer.

5. A fault indicator for sensing a fault current in a three phase three conductor sheathed cable as defined in claim 4 wherein said first, second and third magnetic windings are connected to first, second and third rectifier circuits, respectively, said rectifier circuits providing DC signals to said switching transistor to sound said alarm transducer upon occurrence of a fault current in the cable.

6. A fault indicator for sensing a fault current in a three phase three conductor sheathed cable as defined in claim 5 wherein said rectifier circuits are full wave rectifiers.

7. A fault indicator for sensing a fault current in a three phase three conductor sheathed cable as defined in claim 5 wherein the outputs of said rectifier circuits are connected to an actuator winding, and said alarm circuit includes a reed switch in magnetic communication with said actuator winding, and said switching transistor includes a pair of main electrodes connected between said battery and said alarm transducer, and a control electrode connected to said reed switch, whereby said transistor is conditioned to a conducting state upon actuation of said reed switch.

8. A fault indicator for sensing a fault current in a three phase three conductor sheathed cable as defined in claim 1 wherein said magnetic pole pieces are contained within a flexible collar encircling the cable.

9. A fault indicator for sensing a fault current in a three phase three conductor sheathed cable as defined in claim 8 wherein said collar is split and flexible to facilitate installation on the cable.

10. A fault indicator for sensing a fault current in a three phase three conductor sheathed cable as defined in claim 9 wherein said collar is formed of an elastomeric material.

11. A fault indicator for sensing a fault current in a three phase three conductor sheathed cable as defined in claim 8 wherein said collar includes indicia on its circumference to facilitate alignment on said cable.

12. A fault indicator for sensing a fault current in a three phase three conductor sheathed cable as defined in claim 1 which includes an alignment circuit comprising a voltage indicator coupled across one or more of said magnetic windings to facilitate alignment of said magnetic windings with said conductors in said cable.

13. A fault indicator for sensing a fault current in a three phase three conductor sheathed cable as defined in claim 1 wherein said magnetic pole pieces are each spaced generally at 120° intervals around the circumference of the cable.

14. A fault indicator for sensing a fault current in a three phase three conductor sheathed cable of the type having first, second and third conductors enclosed within a single overlying sheath, comprising:
    first, second and third magnetic sensors, each providing an output signal indicative of the amplitude of a sensed magnetic field, said sensors being arranged around the exterior of said sheath whereby said sensors are primarily in magnetic communication with respective ones of said first, second and third conductors; and
    indicator circuit means responsive to said first, second and third signals for signaling the occurrence of a fault current in one or more of said conductors.

15. A fault indicator for sensing a fault current in a three phase three conductor sheathed cable as defined in claim 14 wherein said fault indicator circuit includes an alarm transducer, a battery and a switching transistor, said switching transistor being conditioned to a conductive state by said signals developed by said windings to connect said battery to said alarm transducer upon occurrence of a fault current in one or more of said conductors.

16. A fault indicator for sensing a fault current in a three phase three conductor sheathed cable as defined in claim 15 further having outputs of rectifier circuits connected to an actuator winding, and an alarm circuit including a reed switch in magnetic communication with said actuator winding, and said switching transistor includes a pair of main electrodes connected between said battery and said alarm transducer, and a control electrode connected to said reed switch, whereby said switching transistor is conditioned to a conducting state upon actuation of said reed switch.

17. A fault indicator for sensing a fault current in a three phase three conductor sheathed cable as defined in claim 14 wherein said magnetic pole pieces are contained within a flexible collar encircling the cable.

18. A fault indicator for sensing a fault current in a three phase three conductor sheathed cable as defined in claim 17 wherein said collar is split and flexible to facilitate installation on the cable.

19. A fault indicator for sensing a fault current in a three phase three conductor sheathed cable as defined in claim 18 wherein said collar is formed of an elastomeric material.

20. A fault indicator for sensing a fault current in a three phase three conductor sheathed cable as defined in claim 17 wherein said collar includes indicia on its circumference to facilitate alignment of said collar relative to said cable.

21. A fault indicator for sensing a fault current in a three phase three conductor sheathed cable as defined in claim 14 including an alignment circuit comprising a voltage indicator coupled across one or more of said magnetic windings to facilitate alignment of said magnetic windings with said conductors in said cable.

22. A fault indicator for sensing a fault current in a three phase three conductor sheathed cable as defined in claim 14 wherein said magnetic pole pieces are each spaced generally at 120° intervals around the circumference of the cable.

23. A fault indicator for sensing a fault current in a three phase three conductor sheathed cable of the type having first, second and third electrical conductors enclosed within the sheath, comprising:
    first, second and third magnetic pickup assemblies arranged generally at 120° intervals around the circumference of the cable sheath, said assemblies each being aligned with a respective one of said conductors and each providing an output signal indicative of the magnetic fields associated with said conductors;
    said magnetic pickup assemblies each comprising a generally U-shaped magnetic pole piece having poles extending to either side of its associated conductor and a central portion, a magnetic winding on said central portion, and a rectifier circuit connected to said magnetic winding for providing an output signal indicative of the magnetic field developed in the pole piece by the associated conductor; and
    indicator circuit means responsive to said first, second and third output signals for signaling the occurrence of a fault current in the conductor.

24. A fault indicator for sensing a fault current in a three phase three conductor sheathed cable as defined in claim 23 wherein said fault indicator circuit includes an alarm transducer, a battery and a switching transistor, said switching transistor being conditioned to a conductive state by the signals on said magnetic windings to connect said battery to said alarm transducer upon occurrence of a fault current in one or more of said conductors.

25. A fault indicator for sensing a fault current in a three phase three conductor sheathed cable as defined in claim 24 wherein the outputs of said rectifier circuits are connected to an actuator winding, and said alarm circuit includes a reed switch in magnetic communication with said actuator winding, and said switching transistor includes a pair of main electrodes connected between said battery and said alarm transducer, and a control electrode connected to said reed switch, whereby said transistor is conditioned to a conducting state upon actuation of said reed switch.

26. A fault indicator for sensing a fault current in a three phase three conductor sheathed cable as defined in claim 23 wherein said magnetic pole pieces are contained within a flexible collar encircling the cable.

27. A fault indicator for sensing a fault current in a three phase three conductor sheathed cable as defined in claim 26 wherein said collar is split and flexible to facilitate installation on the cable.

28. A fault indicator for sensing a fault current in a three phase three conductor sheathed cable as defined in claim 27 wherein said collar is formed of an elastomeric material.

29. A fault indicator for sensing a fault current in a three phase three conductor sheathed cable as defined in claim 26 wherein said collar includes indicia on its circumference to facilitate alignment of said collar on said cable.

30. A fault indicator for sensing a fault current in a three phase three conductor sheathed cable as defined in claim 23 includes an alignment circuit comprising a voltage indicator coupled across one or more of said magnetic windings to facilitate alignment of said magnetic windings relative to said conductors in said cable.

* * * * *